(12) United States Patent
Hera (10) Patent No.: US 9,031,248 B2
(45) Date of Patent: May 12, 2015

(54) VEHICLE ENGINE SOUND EXTRACTION AND REPRODUCTION

(71) Applicant: Bose Corporation, Framingham, MA (US)

(72) Inventor: Cristian M. Hera, Framingham, MA (US)

(73) Assignee: Bose Corporation, Framingham, MA (US)

( * ) Notice: Subject to any disclaimer, the term of this patent is extended or adjusted under 35 U.S.C. 154(b) by 318 days.

(21) Appl. No.: 13/744,850

(22) Filed: Jan. 18, 2013

(65) Prior Publication Data

US 2014/0205110 A1    Jul. 24, 2014

(51) Int. Cl.
| | |
|---|---|
| H03G 3/00 | (2006.01) |
| H03G 3/20 | (2006.01) |
| G10K 15/02 | (2006.01) |
| H04B 1/00 | (2006.01) |

(52) U.S. Cl.
CPC . *H03G 3/20* (2013.01); *G10K 15/02* (2013.01)

(58) Field of Classification Search
CPC ......... G10K 15/02; G10K 15/04; H03G 3/20; H03G 3/00; H04R 3/02; H04S 7/305; H04B 1/00
USPC ........... 381/56, 58, 61, 98, 71.4, 73.1, 63, 66, 381/86; 123/123; 180/313
See application file for complete search history.

(56) References Cited

U.S. PATENT DOCUMENTS

| | | | |
|---|---|---|---|
| 5,686,683 A | 11/1997 | Freed | |
| 8,194,873 B2 | 6/2012 | Pan et al. | |
| 8,306,240 B2 | 11/2012 | Pan et al. | |
| 8,320,581 B2 | 11/2012 | Hera et al. | |
| 8,335,318 B2 | 12/2012 | Pan | |
| 8,355,512 B2 | 1/2013 | Pan et al. | |
| 8,571,230 B2 | 10/2013 | Pan et al. | |
| 2008/0181422 A1 | 7/2008 | Christoph | |
| 2011/0216916 A1* | 9/2011 | Hera et al. | ............ 381/86 |
| 2012/0101611 A1 | 4/2012 | Inoue et al. | |
| 2012/0177214 A1 | 7/2012 | Hera et al. | |

(Continued)

FOREIGN PATENT DOCUMENTS

| | | |
|---|---|---|
| WO | 0133543 A1 | 5/2001 |
| WO | 2012143244 A1 | 10/2012 |

OTHER PUBLICATIONS

International Search Report and Written Opinion dated Jun. 4, 2014 for International application No. PCT/US2013/076915.

(Continued)

*Primary Examiner* — Vivian Chin
*Assistant Examiner* — Ammar Hamid (57) ABSTRACT

An RPM signal representing a current RPM of a vehicle engine is received. An instant magnitude and an instant phase are determined for each of N harmonics of a target engine sound based on the RPM signal. The instant magnitude and the instant phase are each smoothed to generate a smoothed harmonic magnitude and a smoothed harmonic phase for each of the N harmonics. A magnitude perturbation signal and a phase perturbation signal are generated for each of the N harmonics. An individual harmonic signal is also generated for each of the N harmonics based, at least in part, on the smoothed harmonic magnitude, the magnitude perturbation signal, the smoothed harmonic phase, and the phase perturbation signal. The individual harmonic signals are summed to generate an engine harmonic enhancement signal, and the engine harmonic enhancement signal is transduced to acoustic energy.

6 Claims, 5 Drawing Sheets

(56) References Cited

U.S. PATENT DOCUMENTS

2013/0201397 A1     8/2013    Ayoub et al.
2013/0259259 A1    10/2013    Hera
2013/0260692 A1    10/2013    Hera

OTHER PUBLICATIONS

Amman, Scott A. et al: "An Efficient Technique for Modeling and Synthesis of Automotive Engine Sounds", IEEE Transactions on Industrial Electronics, IEEE Service Center, Piscataway, NJ, USA, vol. 48, No. 1, Feb. 1, 2001, XP011023763, ISSN: 0278-0046 paragraph [0004].

Zhekova, Irina: "Analyse temps-frequence et synthese granulaire des bruits moteur diesel au ralenti", Jun. 11, 2010, P55120618, Retrieved from the Internet: URL:http://tel.archives-ouvertes.fr/docs/00/49/14/52/PDF/These Irina Zhekova.pdf [retrieved on May 28, 2014] p. 71-p. 92, p. 101-p. 124.

* cited by examiner

VEHICLE ENGINE SOUND EXTRACTION AND REPRODUCTION

BACKGROUND

This disclosure relates to reproducing a character of an engine sound in a vehicle via engine harmonic enhancement. This method can provide a natural sound for applications in which a high level of enhancement is required.

Some known engine harmonic enhancement methods used harmonic generation based on magnitude only. In some cases, an initial phase difference between the harmonics was introduced. However, such methods may be insufficient to generate a natural sounding, high level of enhancement, or to be able to reproduce a particular engine sound character.

SUMMARY

This disclosure is based, in part, on the realization that the respective phase of each of a plurality of harmonics (e.g., the 0.5 harmonic order through $40^{th}$ harmonic order) over a RPM range (e.g., 600 RPM to 7500 RPM) can be taken into account during harmonic generation in an engine harmonic enhancement (EHE) process. At the same time small variations in phase and magnitude, which confer naturalness to a generated engine sound, can be preserved by introducing a distortion signal in the generation process. This distortion signal has the same standard deviation as the variations identified in the analysis of the original engine sound.

In one aspect, a method includes performing a harmonic decomposition on a target engine sound, thereby to extract each of N harmonics of the target engine sound over an RPM range; and out of the extracted harmonics, extracting phase and shape information for each of the N harmonics over the RPM range for reproducing the target engine sound. The method also includes configuring an engine harmonic enhancement (EHE) system to utilize the extracted phase and shape information to generate an engine harmonic enhancement signal, he(t), to be added on top of a baseline engine sound.

Implementations may include one of the following features, or any combination thereof.

In some implementations, performing the harmonic decomposition includes obtaining a set of frequency weighting coefficients $a_k(t)$ and $b_k(t)$ for each of the N harmonics over the RPM range. It is considered that as time is passing the RPM is increasing, such as at time t=0 the engine is at the lowest RPM and the last moment in time corresponds to the highest RPM.

In certain implementations, performing the harmonic decomposition includes utilizing an adaptive algorithm to obtain the harmonic frequency weighting coefficients $a_k(t)$ and $b_k(t)$.

In some implementations, the adaptive algorithm is a least mean square (LMS) algorithm.

In certain implementations, extracting the phase and shape information for each of the N harmonics includes smoothing out in time the harmonic frequency weighting coefficients $a_k(t)$ and $b_k(t)$, thereby obtaining smoothed harmonic frequency weighting coefficients $\tilde{a}_k(t)$ and $\tilde{b}_k(t)$, for each of the N harmonics over the RPM range.

In some implementations, the smoothing is performed by low pass filtering the harmonic frequency weighting coefficients $a_k(t)$ and $b_k(t)$.

In certain implementations, the low pass filtering is performed with a finite impulse response (FIR) filter.

In some implementations, the finite impulse response (FIR) filter is based on a window (e.g., Hamming, Hanning, Blackman, Blackman-Harris, Kaiser, Chebyshev, etc.), where a length of the window determines the degree by which the harmonic frequency coefficients will be smoothed.

In certain implementations, the low pass filtering is performed with an infinite impulse response (IIR) filter.

In some implementations, extraction of the phase and shape information includes: computing a shape, $\tilde{c}_k(t)$, and a phase, $\tilde{p}_k(t)$, of each of the N harmonics from the smoothed harmonic frequency weighting coefficients $\tilde{a}_k(t)$ and $\tilde{b}_k(t)$; assuming that an RPM-dependent shape, $\tilde{c}_k(RPM)$, and an RPM-dependent phase, $\tilde{p}_k(RPM)$, of each of the N harmonics over the RPM range is represented by the shape, $\tilde{c}_k(t)$, and the phase, $\tilde{p}_k(t)$, computed in time, such that $\tilde{c}_k(t)=\tilde{c}_k(RPM)$ and $\tilde{p}_k(t)=\tilde{p}_k(RPM)$; and defining each of the N harmonics as a pair of vectors $[C_k]$ and $[P_k]$ that contain samples of the RPM-dependent shape, $\tilde{c}_k(RPM)$, and of the RPM-dependent phase, $\tilde{p}_k(RPM)$, respectively, over a subset of RPM values.

In certain implementations, the shape of each of the N harmonics is computed as:

$$\tilde{c}_k(t) = \sqrt{\tilde{a}_k^2(t) + \tilde{b}_k^2(t)};$$

and the phase of each of the N harmonics is computed as:

$$\tilde{p}_k(t) = \text{unwrap}\left\{\text{atan}\left(\frac{\tilde{b}_k(t)}{\tilde{a}_k(t)}\right) - \pi \cdot \max\{\text{sign}(a_k(t)), 0\}\right\}.$$

In some implementations, the method further includes operating the EHE system to transduce the engine harmonic enhancement signal, he(t), to acoustic energy.

In certain implementations, configuring the engine harmonic enhancement system to utilize the extracted phase and shape information to generate the engine harmonic enhancement signal, he(t), includes configuring the engine harmonic enhancement system to: receive an RPM signal representing a current RPM of a vehicle engine; based on the RPM signal, determine an instant magnitude, $\bar{c}_k(t)$, for each of the N harmonics by interpolating the instant magnitude, $\bar{c}_k(t)$, from a magnitude table $[C_k]$ wherein the magnitude table $[C_k]$ includes samples of an RPM-dependent shape, $\tilde{c}_k(RPM)$, for each of the N harmonics over a subset of RPM values; based on the RPM signal, determine an instant phase, $\bar{p}_k(t)$, for each of the N harmonics by interpolating the instant phase, $\bar{p}_k(t)$, from a phase table $[P_k]$, wherein the phase table $[P_k]$ includes samples of an RPM-dependent phase $\tilde{p}_k(RPM)$, for each of the N harmonics over the subset of RPM values; smooth the instant magnitude, $\bar{c}_k(t)$, to generate a smoothed harmonic magnitude, $\hat{c}_k(t)$, for each of the N harmonics; smooth the instant phase, $\bar{p}_k(t)$, to generate a smoothed harmonic phase, $\hat{p}_k(t)$, for each of the N harmonics; generate a magnitude perturbation signal, $dc_k(t)$, for each of the N harmonics; generate a phase perturbation signal, $dp_k(t)$, for each of the N harmonics; and generate an individual harmonic signal, $h_k(t)$, for each of the N harmonics according to: $h_k(t)=(\hat{c}_k(t)+dc_k(t))\cdot\sin(2\pi fl_k t+\hat{p}_k(t)+dp_k(t))$; and sum the individual harmonic signals, $h_k(t)$, and thereby generate the engine harmonic enhancement signal, he(t).

In some implementations, N is an integer from 40 to 80.

In certain implementations, the RPM range is 600 RPM to 7500 RPM.

In another aspect, a non-transitory computer-readable medium bears instructions to cause a processor to perform a harmonic decomposition on a target engine sound, thereby to extract each of N harmonics of the target engine sound over an RPM range; and out of the extracted harmonics, extract phase and shape information for each of the N harmonics over the RPM range for reproducing the target engine sound.

Implementations may include one of the above and/or below features, or any combination thereof.

In yet another aspect, a method includes: in a vehicle engine harmonic enhancement system, receiving an RPM signal representing a current RPM of a vehicle engine; based on the RPM signal, determining an instant magnitude, $\bar{c}_k(t)$, for each of N harmonics of a target engine sound by interpolating the instant magnitude, $\bar{c}_k(t)$, from a vector $[C_k]$, wherein the vector $[C_k]$ includes samples of an RPM-dependent shape, $\tilde{c}_k(RPM)$, for each of the N harmonics over a subset of RPM values; based on the RPM signal, determining an instant phase, $\bar{p}_k(t)$, for each of the N harmonics by interpolating the instant phase, $\bar{p}_k(t)$, from a vector $[P_k]$, wherein the vector $[P_k]$ includes samples of an RPM-dependent phase $\tilde{p}_k(RPM)$, for each of the N harmonics over the subset of RPM values; smoothing the instant magnitude, $\bar{c}_k(t)$, to generate a smoothed harmonic magnitude, $\hat{c}_k(t)$, for each of the N harmonics; smoothing the instant phase, $\bar{p}_k(t)$, to generate a smoothed harmonic phase, $\hat{p}_k(t)$, for each of the N harmonics; generating a magnitude perturbation signal, $dc_k(t)$, for each of the N harmonics; generating a phase perturbation signal, $dp_k(t)$, for each of the N harmonics; and generating an individual harmonic signal, $h_k(t)$, for each of the N harmonics according to: $h_k(t)=(\hat{c}_k(t)+dc_k(t))\cdot\sin(2\pi fl_k t+\hat{p}_k(t)+dp_k(t))$; summing the individual harmonic signals, $h_k(t)$, and thereby generating an engine harmonic enhancement signal, he(t) to be added on top of a baseline engine sound; and transducing the engine harmonic enhancement signal, he(t), to acoustic energy.

Implementations may include one of the above and/or below features, or any combination thereof.

In some implementations, generating the magnitude perturbation signal includes generating the magnitude perturbation signal, $dc_k(t)$, for each of the N harmonics according to:

$$dc_k(t) = ncf_k(t) \cdot \frac{\sigma_{\Delta c_k}}{\sigma_{ncf_k}},$$

where $\sigma_{\Delta c_k}$ is the standard deviation of fluctuations in the harmonic magnitude of each of the N harmonics of the target engine sound; $ncf_k(t)$ is filtered random noise used for generating the magnitude perturbation signal; and $\sigma_{ncf_k}$ is the standard deviation for the filtered random noise used for generating the magnitude perturbation signal.

In certain implementations, generating the phase perturbation signal includes generating the phase perturbation signal, $dp_k(t)$, for each of the N harmonics according to:

$$dp_k(t) = npf_k(t) \cdot \frac{\sigma_{\Delta p_k}}{\sigma_{npf_k}},$$

where $\sigma_{\Delta p_k}$ is the standard deviation of fluctuations in the harmonic phase of each of the N harmonics of the target engine sound; $npf_k(t)$ is filtered random noise used for generating the phase perturbation signal; and $\sigma_{npf_k}$ is the standard deviation for the filtered random noise used for generating the phase perturbation signal.

In another aspect, an engine harmonic enhancement system, includes: a digital signal processor; and a memory coupled to the digital signal processor and containing instructions that, when executed, cause the digital signal processor to: receive an RPM signal representing a current RPM of a vehicle engine; based on the RPM signal, determine an instant magnitude, $\bar{c}_k(t)$, for each of N harmonics of a target engine sound by interpolating the instant magnitude, $\bar{c}_k(t)$, from a vector $[C_k]$, wherein the vector $[C_k]$ includes samples of an RPM-dependent shape, $\tilde{c}_k(RPM)$, for each of the N harmonics over a subset of RPM values; based on the RPM signal, determine an instant phase, $\bar{p}_k(t)$, for each of the N harmonics by interpolating the instant phase, $\bar{p}_k(t)$, from a vector $[P_k]$, wherein the vector $[P_k]$ includes samples of an RPM-dependent phase $\tilde{p}_k(RPM)$, for Each of the N harmonics over the subset of RPM values; smooth the instant magnitude, $\bar{c}_k(t)$, to generate a smoothed harmonic magnitude, $\hat{c}_k(t)$, for each of the N harmonics; smooth the instant phase, $\bar{p}_k(t)$, to generate a smoothed harmonic phase, $\hat{p}_k(t)$, for each of the N harmonics; generate a magnitude perturbation signal, $dc_k(t)$, for each of the N harmonics; generate a phase perturbation signal, $dp_k(t)$, for each of the N harmonics; and generate an individual harmonic signal, $h_k(t)$, for each of the N harmonics according to: $h_k(t)=(\hat{c}_k(t)+dc_k(t))\cdot\sin(2\pi fl_k t+\hat{p}_k(t)+dp_k(t))$; sum the individual harmonic signals, $h_k(t)$, and thereby generating an engine harmonic enhancement signal, he(t) to be added on top of a baseline engine sound; and transduce the engine harmonic enhancement signal, he(t), to acoustic energy.

Implementations may include one of the above features, or any combination thereof.

DETAILED DESCRIPTION

Though the elements of several figures may be shown and described as discrete elements in a block diagram and may be referred to as "circuitry", unless otherwise indicated, the elements may be implemented as one of, or a combination of, analog circuitry, digital circuitry, or one or more microprocessors executing software instructions. The software instructions may include digital signal processing (DSP) instructions. Operations may be performed by analog circuitry or by a microprocessor executing software that performs the mathematical or logical equivalent to the analog operation. Unless otherwise indicated, signal lines may be implemented as discrete analog or digital signal lines, as a single discrete digital signal line with appropriate signal processing to process separate streams of audio signals, or as elements of a wireless communication system. Some of the processes may be described in block diagrams. The activities that are performed in each block may be performed by one element or by a plurality of elements, and may be separated in time. The elements that perform the activities of a block may be physically separated. One element may perform the activities of more than one block. Unless otherwise indicated, audio signals or video signals or both may be encoded and transmitted in either digital or analog form; conventional digital-to-analog or analog-to-digital converters may be omitted from the figures.

Figure 1:
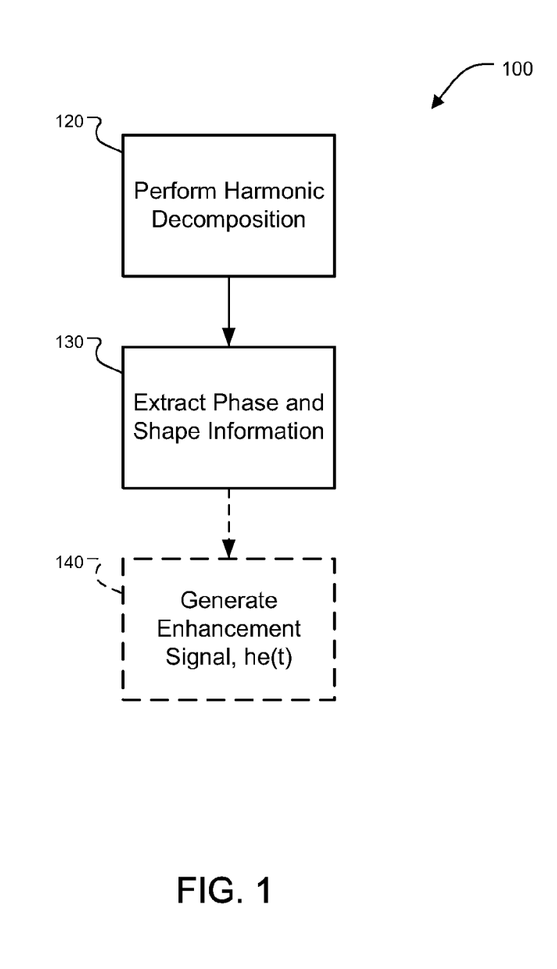
FIG. 1 is a flow diagram of an example process for extracting parameters that define the character of a target engine sound and which can be used for reproducing the character of a target engine sound.

The degree by which the character of a target sound can be reproduced in a vehicle depends on the vehicle's engine baseline sound. FIG. 1 illustrates an exemplary process that can be particularly useful for applications where large enhancements, relative to the vehicle baseline, are desired. The psychoacoustic parameters that define the character of a target engine sound can be extracted directly from the target engine sound.

Referring to FIG. 1, an exemplary process 100 of reproducing the character of a particular engine sound (a target engine sound). The process 100 includes performing a harmonic decomposition on the target engine sound (120) to extract the harmonics of the target engine sound, and, out the extracted harmonics, extracting sufficient phase and shape information (e.g., for each of the extracted harmonics) to reproduce the character of target engine sound (130). Then, an enhancement signal can be generated (140) which can be added on top of a baseline engine sound to reproduce the target engine sound.

The degree by which the target sound is reproduced can depend on the baseline sound. If the baseline sound harmonics are louder than all the target sound harmonics, there will be no change in the obtained sound. However, the level of enhancement can be increased to a degree that will dominate the baseline, in which case the obtained sound can get very close to the target engine sound.

Engine Sound Harmonic Decomposition

The engine sound of a vehicle, as perceived in the cabin of the vehicle, can be assumed to be the sum of engine speed harmonics, broadband engine noise, wind noise, tire noise, and noise generated by other sources. To simplify, the engine sound can be represented by the sum of engine speed harmonics plus broadband noise. Considering only the harmonics of the engine sound, each harmonic amplitude and phase can be assumed to vary in time according to the following formula:

$$h_k(t) = c_k(t) \cdot \sin(\omega_k(t) \cdot t + \phi_k(t))$$

where $$\omega_k = 2\pi f_k = 2\pi l_k f_1 = 2\pi l_k \frac{RPM}{60};$$

$f_1$ is the fundamental frequency; $l_k$ is the harmonic order that usually is a multiple of 0.5, but, in general, can be a positive non-zero real number; RPM is the engine speed; and $f_k$ is the frequency, in Hz, of harmonic k.

The target engine sound can be written as the sum of all contributing harmonics:

$$x(t) = \Sigma_{k=1}^{N} c_k(t) \cdot \sin(\omega_k(t) \cdot t + \phi_k(t))$$

Figure 2:
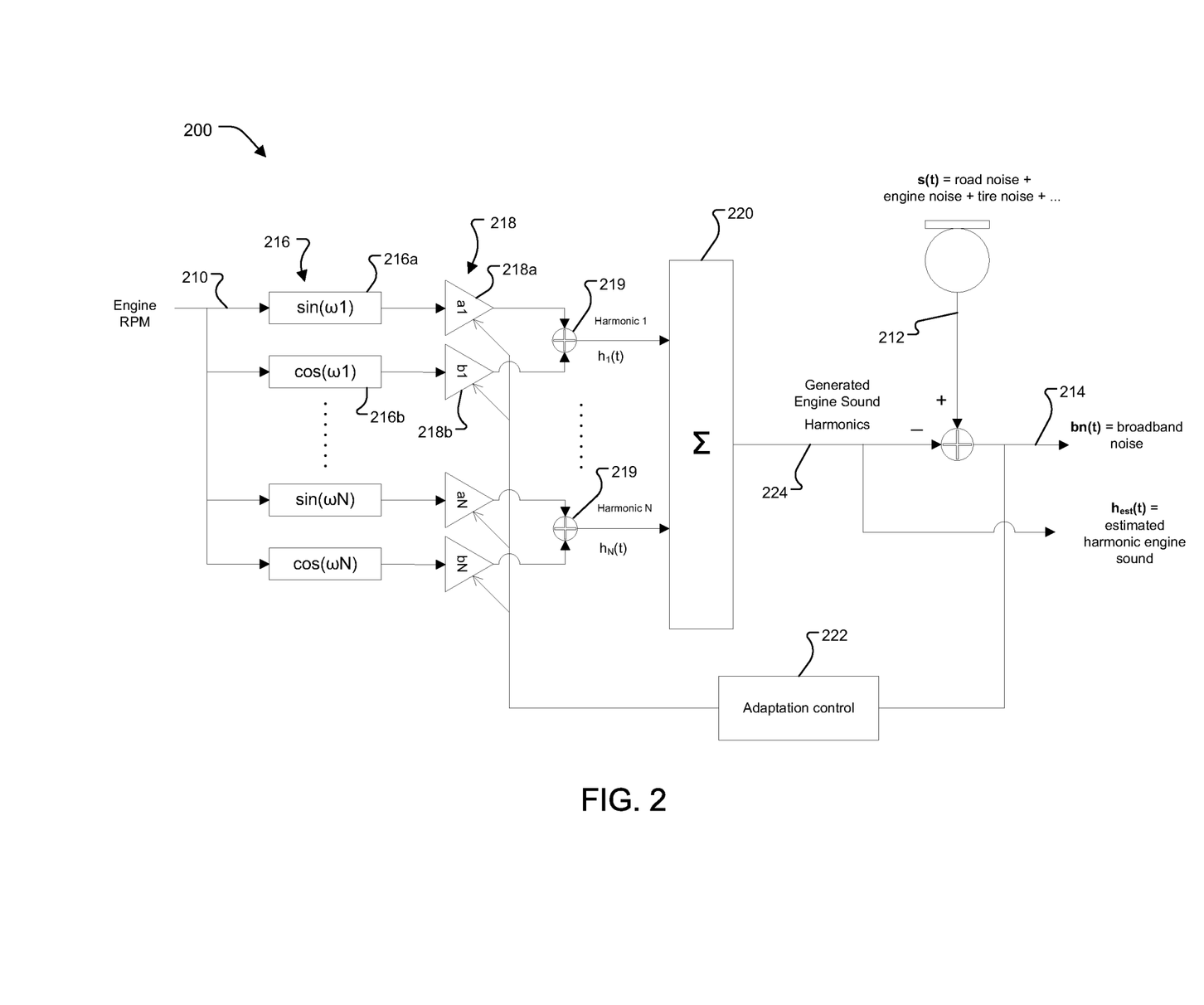
FIG. 2 is a block diagram of an adaptive linear combiner.

FIG. 2 illustrates an implementation of an adaptive linear combiner 200 that can be utilized to extract the harmonics. The adaptive linear combiner 200 can be used to identify the engine harmonics and their evolution in time. The adaptive linear combiner 200 can allow for the continuous identification under any engine state and engine mode of operation.

The adaptive linear combiner 200 accepts an RPM signal 210 and a microphone signal 212 (i.e., the target engine sound signal, s(t), e.g., as measured by one or more microphones in a passenger compartment of the vehicle which produces the target engine sound) and processes the inputs 210, 212 to generate an engine noise-free signal 224 (i.e., the engine harmonics $h_{est}(t)$) and the broadband engine noise, bn(t) 214.

The adaptive linear combiner 200 includes N harmonic frequency generators 216, N sets of harmonic frequency weighting coefficients 218, N summers 219, a harmonics summer 220, and an adaptation control module 222.

Each harmonic can be expressed as follows:

$$h_k(t) = c_k(t) \cdot \sin(\omega_k(t) \cdot t + \varphi_k(t))$$
$$= c_k(t) \cdot \sin(\omega_k(t) \cdot t) \cdot \cos(\varphi_k(t)) + c_k(t) \cdot \cos(\omega_k(t) \cdot t) \cdot \sin(\varphi_k(t))$$
$$= a_k(t) \cdot \sin(\omega_k(t) \cdot t) + b_k(t) \cdot \cos(\omega_k(t) \cdot t)$$

Where: $a_k(t) = c_k(t) \cdot \cos(\phi_k(t))$ and $b_k(t) = c_k(t) \cdot \sin(\phi_k(t))$ Thus, to generate the unweighted sine and cosine components of each of N harmonics, each of the N harmonic frequency generators 216 includes both a sine component generator 216a and a cosine component generator 216b. When the harmonic frequency generators 216 receive the RPM signal 210, the RPM signal 210 is converted to a frequency and used by the sine and cosine component generators 216a, 216b to generate sine and cosine components for the frequency. For example, based on the RPM signal 210, the frequencies of both the sine component 216a and the cosine component 216b of the first harmonic generator 216 are set to the fundamental angular frequency (i.e., $\omega_1 = 2\pi f_1$) of the target engine sound, the frequencies of sine and cosine components of the second harmonic frequency generator are set to twice the fundamental angular frequency (i.e., $2 \cdot \omega_1 = \omega_2 = 4\pi f_1$)) of the target engine sound, the frequencies of the sine and cosine components of the third harmonic frequency generator are set to three times the fundamental angular frequency (i.e., $3 \cdot \omega_1 = \omega_3 = 6\pi f_1$) of the target engine sound, and so on. This scheme includes full order, half orders, and can also include fractional orders. In some examples the sine and cosine component generators 216a, 216b include look-up tables for generating the sine and cosine components.

The N sine components 216a and the N cosine components 216b generated by each of the harmonic frequency generators 216 are then passed to the N sets of harmonic frequency weighting coefficients 218. Each set of harmonic frequency weighting coefficients 218 includes a first weighting coefficient $a_k(t)$ 218a for weighting the sine component 216a of the generated harmonic frequency and a second weighting coefficient $b_k(t)$ 218b for weighting the cosine component 216b of the generated harmonic frequency.

After the generated harmonic frequency components 216a, 216b for each of the harmonic frequency generators 216 are weighted by their corresponding harmonic frequency weighting coefficients 218 the pairs of weighted harmonic frequency components are summed by respective summers 219 to produce N harmonics $h_1(t) - h_N(t)$, which are then summed at harmonics summer 220 to produce an estimate of the engine noise 224 (i.e., the estimated harmonic engine sound, $h_{est}(t)$). The estimate of the engine noise 224 is combined with the microphone signal 212, resulting in the broadband noise, bn(t).

In operation, the adaptive linear combiner 200 adaptively determines the estimate of the engine noise 224. That is, the adaptive linear combiner 200 adapts the N sets of harmonic frequency weighting coefficients 218 to converge to the engine noise-free signal 214 (i.e., the broadband noise, bn(t)). Thus, the engine noise-free signal 214 can also be viewed as an error signal for an adaptive filter. This error signal is passed to an adaptation control module 222 which uses the error signal to determine a coefficient update for the N sets of harmonic frequency weighting coefficients 218.

In some examples, the adaptation control module 222 determines the coefficient update using a least mean squares (LMS) approach. The following exemplifies the use of the LMS algorithm.

Using the following notation: X(t) is the input vector at moment t; W(t) is the coefficients vector; $h_{est}(t)$ is the estimated harmonic engine sound is the output of the linear combiner; s(t) the microphone signal is the desired signal; and the error in estimation is the broadband noise bn(t).

$$X(t) = \begin{bmatrix} \sin(\omega_1(t) \cdot t) \\ \cos(\omega_1(t) \cdot t) \\ \vdots \\ \sin(\omega_N(t) \cdot t) \\ \cos(\omega_N(t) \cdot t) \end{bmatrix},$$

$$W(t) = \begin{bmatrix} a_1(t) \\ b_1(t) \\ \vdots \\ a_N(t) \\ b_N(t) \end{bmatrix}$$

The update equations for the adaptive linear combiner are:

$$h_{est}(t) = X(t)^T \cdot W(t)$$

$$bn(t) = s(t) - y(t)$$

$$W(t+1) = W(t) + \mu \cdot bn(t) \cdot X(t)$$

The step size of the adaptive algorithm, μ, can be set to a value that extracts the harmonics only, separating these from the broadband noise. The step size μ can be selected based on subjective listening tests, by listening to the broadband noise, $bn(t) = s(t) - h_{est}(t)$. If one cannot hear any harmonic content, the identification of the harmonics is considered successful. A visual identification of a spectrogram can validate the subjective findings.

Alternatively, a good identification of the harmonics can be recognized by comparing loudness spectrograms of the extracted harmonics and of the residual broadband noise for different step sizes. For the residual broadband noise, a well spread loudness, without peaks in the frequency domain, over the duration of the sound recording is identified. The lowest step size that shows this property is the one that can be considered for analysis. When analyzing the extracted harmonics, the loudness spectrogram that shows all the harmonic details, for the lowest step size is identified. This can be recognized by the fact that higher step sizes do not add more definition to the loudness spectrogram. This is the step size that can be considered in the analysis. Finally, comparing the step sizes identified via the previous tests, the lowest that satisfies both tests is selected. This is the step size that will be used in the identification process. The rate of change for lower versus higher order harmonics is different; therefore choosing a different step size per harmonic is helpful.

Other complex order analysis methods can also be used to identify the harmonics. Methods based on fast Fourier transform (FFT) constitute a good example. In other examples, the adaptation linear combiner 200 determines the coefficient update using a recursive least squares (RLS) approach.

Extraction of Phase and Shape Information

Start with a recording of the engine sound that is desired to be reproduced. Preferably, the recording is taken under wide open throttle (WOT), starting from the lowest RPM possible up to red line, preferably in the $3^{rd}$ gear. Running a harmonic decomposition, as described in the previous section, one can obtain the harmonic frequency weighting coefficients $a_k(t)$ and $b_k(t)$ for each of N harmonics over an RPM range.

Figure 3:
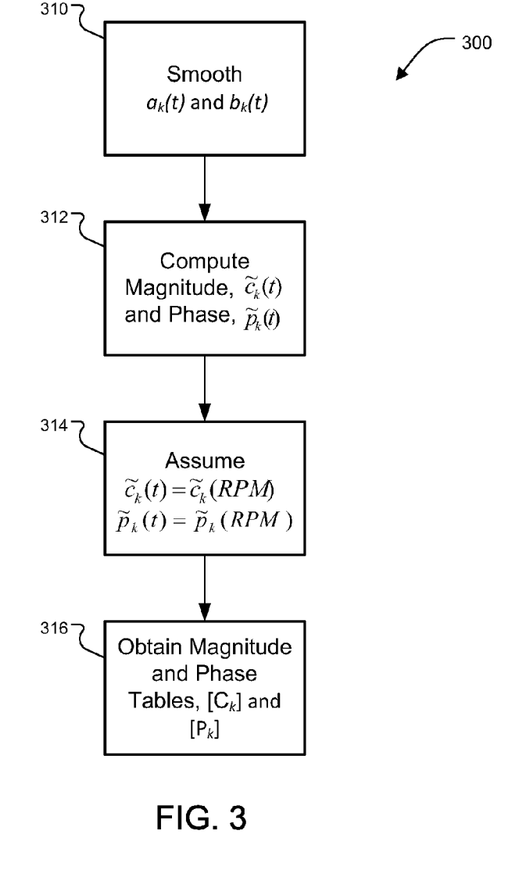
FIG. 3 is a flow diagram of an example process for extracting phase and shape information for preserving the character of the target engine sound.

After the harmonic frequency weighting coefficients $a_k(t)$ and $b_k(t)$ are obtained via the harmonic decomposition process described in the previous section, the next step is to extract the minimum phase and shape information (130, FIG. 1) needed to preserve the character of the target engine sound. Referring to FIG. 3, the first step in extraction of the phase and shape information (130) is to smooth out in time the harmonic frequency weighting coefficients $a_k(t)$ and $b_k(t)$, obtaining $\tilde{a}_k(t)$ and $\tilde{b}_k(t)$ (310), for each of the N harmonics over the RPM range.

The smoothing is performed by low pass filtering $a_k(t)$ and $b_k(t)$. The LP filter can be a finite impulse response (FIR) filter based on a Hamming window, where the length of the window determines the degree by which the coefficients will be smoothed. The shape (magnitude) of each of the N harmonics can then be computed (312) as:

$$\tilde{c}_k(t) = \sqrt{\tilde{a}_k^2(t) + \tilde{b}_k^2(t)}$$

and the phase is computed (312) as:

$$\tilde{p}_k(t) = \text{unwrap}\left\{ \text{atan}\left( \frac{\tilde{b}_k(t)}{\tilde{a}_k(t)} - \pi \cdot \max\{\text{sign}(\tilde{a}_k(t)), 0\} \right) \right\}$$

For the FIR filter, a window length between of 5 ms to 20 ms is suitable for this smoothing. Furthermore, while an FIR LP filter with a Hamming window has been described, any type of window can be used, e.g., Hanning, Blackman, Blackman-Harris, Kaiser, Chebyshev, etc. Furthermore, any type of LP filter can be used including, for example, an infinite impulse response (IIR) filter. For the IIR filter there will be no windowing used.

The engine sound can be approximated by the sum of harmonics expressed as:

$$h_k(t) = \tilde{c}_k(t) \cdot \sin(2\pi f l_k t + \tilde{p}_k(t))$$

The computed phase $\tilde{p}_k(t)$ can also be looked at as a deviation in frequency from the actual harmonic frequency. This frequency deviation is:

$$\Delta f_k(t) = \frac{\tilde{p}_k(t)}{2\pi l_k t}$$

Then, it will be assumed that the shape and phase of each harmonic over the RPM range is represented by the shape and phase obtained in the measurement in time (314):

$$\tilde{c}_k(t) = \tilde{c}_k(\text{RPM})$$

$$\tilde{p}_k(t) = \tilde{p}_k(\text{RPM})$$

where, RPM, is the engine speed over the sweep. The two signals are defined in a very high resolution, with samples taken at the sampling rate.

This can be too much information to store; however, the amount of information can be reduced, by defining each harmonic as two vectors that contain samples of $\tilde{c}_k(RPM)$ and $\tilde{p}_k(RPM)$. First, the samples for which the RPM values increase monotonically are selected. Then, those signals are decimated to obtain vectors $[C_k]$ and $[P_k]$ (also known as the magnitude and phase tables), which define the magnitude (shape) and phase of each of the N harmonics over a subset of RPM values (316). The points can be spaced equidistantly over the RPM range, or selected, in such a way, to maximize the retained information.

An alternative approach is to further smooth $\tilde{c}_k(t)$ and $\tilde{p}_k(t)$, obtaining $\tilde{\tilde{c}}_k(t)$ and $\tilde{\tilde{p}}_k(t)$, which can then be used to compute the magnitude and phase tables, $[C_k]$ and $[P_k]$.

Generation of Enhancement Signal

The phase and shape information about the target engine sound that was derived via the decomposition (120, FIG. 1) and extraction (130, FIG. 1) steps discussed in the previous sections can then be utilized to reproduce the desired, target engine sound in a subject vehicle. As used herein, the term "subject vehicle" refers to a vehicle in which an engine harmonic enhancement is provided to reproduce the target engine sound. The subject automobile may, for example, be a particular automobile model that is different from another automobile model which produced the original, recorded target engine sound.

Figure 4:
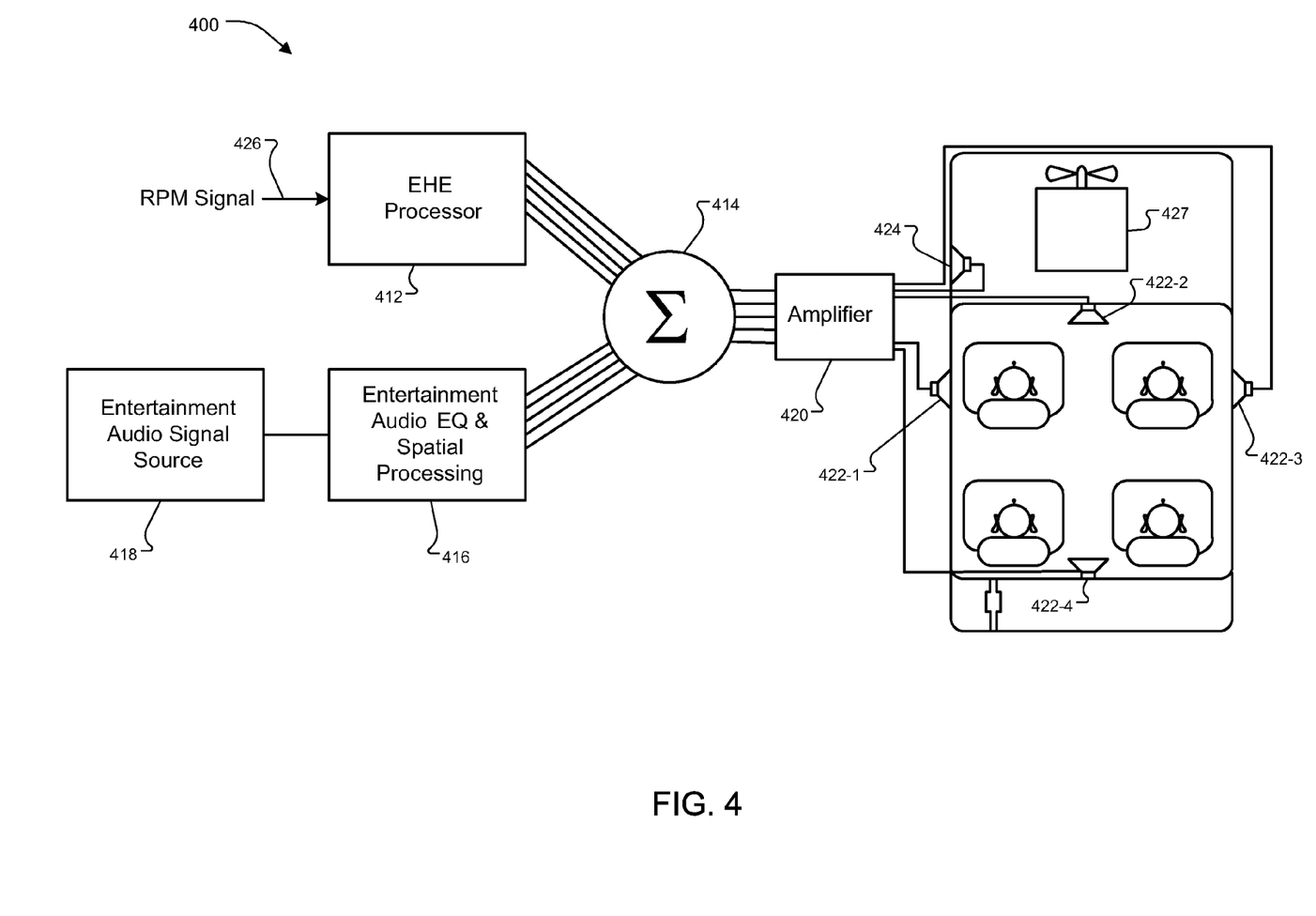
FIG. 4 is a block diagram of a vehicle including a vehicle engine sound enhancement system.

FIG. 4 is a block diagram of a subject vehicle including a vehicle sound enhancement system 400. An engine harmonic enhancement (EHE) processor 412 (e.g., a digital signal processor) is coupled to a summer 414. Also coupled to the summer 414 by an entertainment audio equalizer and spatial processor 416 is an entertainment audio signal source 418. The summer 414 is coupled through a multi-channel amplifier 420 to a number of loudspeakers 422-1-422-4 positioned about the vehicle cabin, and in some implementations, may be positioned, for example, as loudspeaker 424 to radiate acoustic energy to the exterior of the vehicle. The couplings between the EHE processor 412, the entertainment audio equalizer and spatial processor 416, the summer 414, and the amplifier 420 may be multi-channel, as indicated by the multiple lines. Signal lines may be implemented as discrete analog or digital signal lines, as a single discrete digital signal line with appropriate signal processing to process separate streams of audio signals, or as elements of a wireless communication system.

In operation, the entertainment audio source 418 and entertainment audio equalizer and spatial processor 416 operate conventionally, to provide equalized and spatially processed audio entertainment to occupants of the vehicle cabin. In some implementations, the entertainment audio signal source 418 can include announcement audio signals, for navigation, warning signals, and the like. The EHE processor 412 receives an RPM signal 426 representative of a number of revolutions per minute of an engine 427 of the subject vehicle as input. The EHE processor 412 uses the input signal 426 to form an engine harmonic enhancement signal, he(t), which is provided to speakers 422-1-422-4 and 424 for presentation to an automobile operator. The engine harmonic enhancement signal, he(t), and the processed entertainment audio signals are summed at summer 414, amplified by amplifier 420, and transduced to acoustic energy by the loudspeakers 422-1-422-4, and 424

Figure 5:
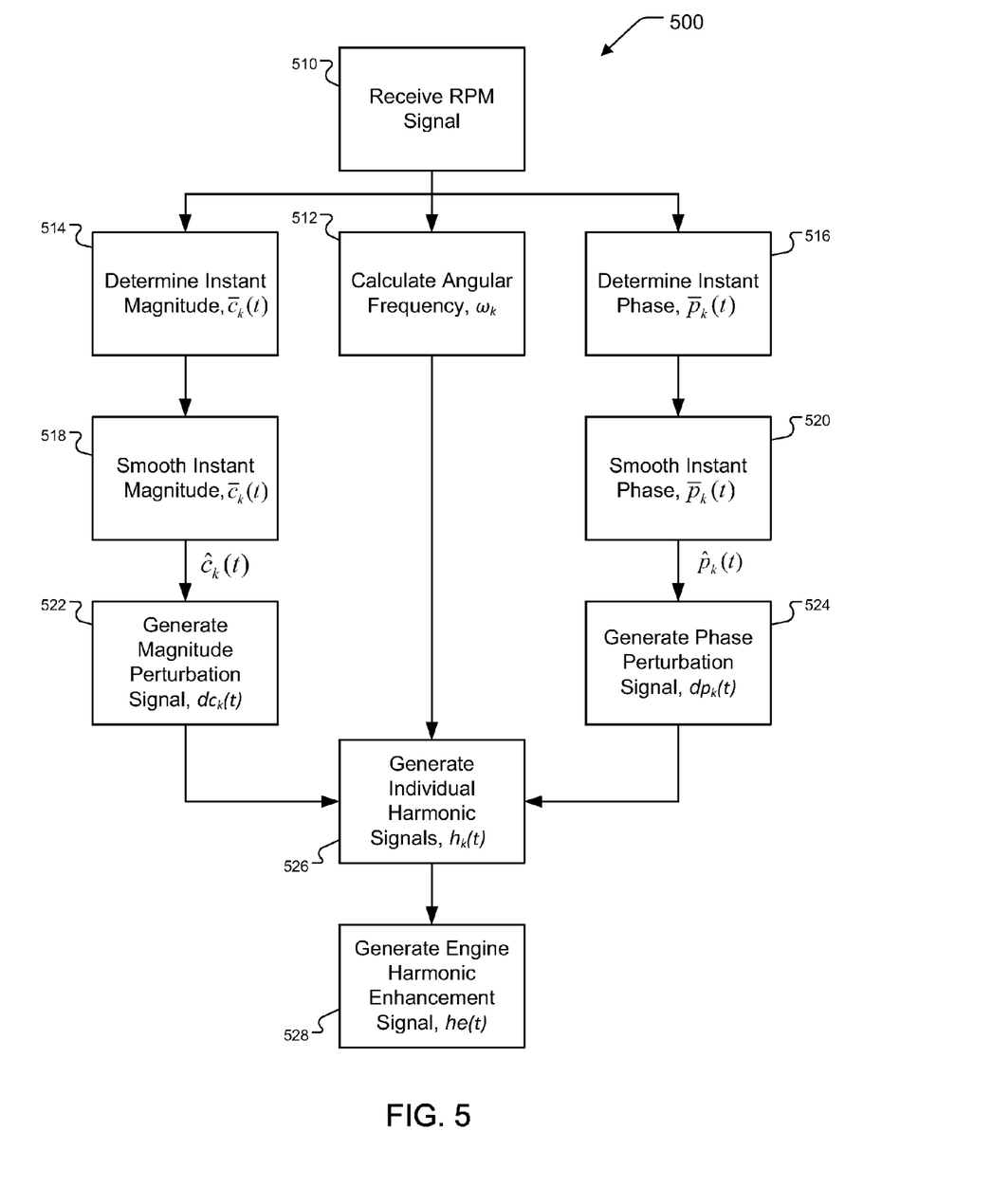
FIG. 5 is a flow diagram of an example process, which may be employed by the vehicle engine sound enhancement system of FIG. 4, for reproducing the desired, target engine sound in a subject automobile.

FIG. 5 illustrates an example process 500 that can be employed (e.g., via the EHE processor 412 of FIG. 4) to reproduce the desired, target engine sound in a subject automobile. The RPM signal 426 is received (510) by the EHE processor 412 of FIG. 4. An angular frequency $$\left(\omega_k = 2\pi f_k = 2\pi l_k f_1 = 2\pi l_k \frac{RPM}{60}\right)$$

is calculated for each of N harmonics based on based on the RPM signal 426 (512).

Based on the current RPM, the instant magnitude, $\bar{c}_k(t)$, can be determined for each harmonic by interpolating the value from the vector $[C_k]$ (514), and the instant phase, $\bar{p}_k(t)$, can be determined for each harmonic by interpolating the value from the vector $[P_k]$ (516); the vectors $[C_k]$ and $[P_k]$ having been previously determined (e.g., by the vehicle and/or sound system manufacturer) via the extraction process.

Because the RPM is generally updated only once every 10 to 30 ms, regardless of the number of points used in the magnitude and phase tables, the interpolated signal will show abrupt changes when the RPM changes. For this reason, the interpolation of the instant magnitude, $\bar{c}_k(t)$, (514) is followed by a first order magnitude smoothing step (518) to eliminate abrupt changes to the instant magnitude, $\bar{c}_k(t)$, when the RPM value is updated. Similarly, the interpolation of the instant phase, $\bar{p}_k(t)$, (516) is followed by a first order phase smoothing step (520) to eliminate abrupt changes to the instant phase, $\bar{p}_k(t)$, when the RPM value is updated. It is beneficial to smooth both the phase and the magnitude of each harmonic, but the phase impacts more the quality of the generated signal. The smoothed generated harmonic magnitude will be denoted by $\hat{c}_k(t)$, and the smoothed generated harmonic phase by $\hat{p}_k(t)$.

Because of the smoothing done in the table computation step (the extraction process (130)), the naturally occurring variations in the magnitude and phase are filtered out. Because the actual fluctuations in the magnitude of each harmonic are not available in the harmonic generation stage, fluctuations can be created that have similar statistical properties as those measured in the extraction stage.

To estimate the fluctuations that where lost in the approximation of each harmonic magnitude, $\tilde{c}_k(t)$ is compared to $\tilde{\tilde{c}}_k(t)$ to compute $\Delta c_k$ according to:

$$\Delta c_k(t) = \tilde{c}_k(t) - \tilde{\tilde{c}}_k(t)$$

The standard deviation of $\Delta c_k$, $\sigma_{\Delta c_k}$, can be determined as part of the extraction process or at some other point prior to the generation process. The standard deviation, $\sigma_{\Delta c_k}$, will be used as a measure of the magnitude fluctuation for each of the N harmonics, in the generation process.

Starting with the generation of random noise, $nc_k(t)$, with a normal distribution, that is low pass filtered with a cutoff frequency around 25 Hz to obtain $ncf_k(t)$. The noise signals need to be different for each harmonic. The standard deviation for the filtered noise can be estimated based on the generation method, and will be denoted here as $\sigma_{nfc_k}$.

The fluctuations in the magnitude are obtained by generating the following magnitude perturbation signal for each of the N harmonics (522):

$$dc_k(t) = ncf_k(t) \cdot \frac{\sigma_{\Delta c_k}}{\sigma_{ncf_k}},$$

where $ncf_k(t)$ is the filtered noise used in the magnitude generation, and where $dc_k(t)$ is the distortion (perturbation) signal that creates the fluctuations in the generated harmonic magnitude.

Similarly a fluctuation signal can be generated for the phase (524). To estimate the fluctuations that where lost in the approximation of each harmonic phase, $\tilde{p}_k(t)$ is compared to $\tilde{\tilde{p}}_k(t)$ to compute $\Delta p_k(t)$ according to:

$$\Delta p_k(t) = \tilde{p}_k(t) - \tilde{\tilde{p}}_k(t),$$

The standard deviation of $\Delta p_k$, $\sigma_{\Delta p_k}$, can be determined as part of the extraction process or at some other point prior to the generation process. The standard deviation, $\sigma_{\Delta p_k}$, will be used as a measure of the magnitude fluctuation for each of the N harmonics, in the generation process.

Starting with the generation of random noise, $np_k(t)$, with a normal distribution, that is low pass filtered with a cutoff frequency around 25 Hz to obtain $npf_k(t)$. The noise signals need to be different for each harmonic. The standard deviation for the filtered noise can be estimated based on the generation method, and will be denoted here as $\sigma_{npf_k}$.

The fluctuations in the phase are obtained by generating the following phase perturbation signal for each of the N harmonics (524):

$$dp_k(t) = npf_k(t) \cdot \frac{\sigma_{\Delta p_k}}{\sigma_{npf_k}},$$

where $npf_k(t)$ is the filtered noise used in the phase generation, and where $dp_k(t)$ is the distortion (perturbation) signal that creates the fluctuations in the generated harmonic phase.

An individual harmonic signal, $h_k(t)$, is generated (526) for each of the N harmonics according to:

$$h_k(t) = (\hat{c}_k(t) + dc_k(t)) \cdot \sin(2\pi f l_k t + \hat{p}_k(t) + dp_k(t))$$

Notably, the phase information for each of the N harmonics is included in the generation of the individual harmonic signals (526). The individual harmonic signals, $h_k(t)$, are added together to generate an engine harmonic enhancement signal, $he(t) = \sum_{k=1}^{N} h_k(t)$, that will be played via the sound system of the subject vehicle to complement the original engine sound of the subject vehicle (528).

In some implementations, the EHE processor 412 can be configured to determine an amount of gain or delay to be applied to the engine harmonic enhancement signal, he(t). For example, the EHE processor 412 may include an EHE gain and delay determiner which determines an amount of gain and delay to be applied to the engine harmonic enhancement signal, he(t), by an EHE overall enhancement gain. The EHE gain and delay determiner may apply a gain function (also referred to as "mapping function" or "mapping") which includes as variables the engine load, the change in engine load, the RPM, and the rate of change in RPM to determine the EHE gain (as described in U.S. patent application Ser. No. 12/716,887). Additionally, the gain function applied by the EHE gain and delay determiner may use as variables values of other parameters, such as the gear in which the vehicle is operating; the transmission ratio or transmission ratio interval of a continuously variable transmission (CVT); and an operational mode of the engine. The EHE gain and delay determiner may smooth the gain values so that the sound variation is natural, and undistorted, similar to the sound variation in time of a mechanical system.

Alternatively or additionally, the EHE processor 412 can include a sound stage processor (as described in U.S. patent application Ser. No. 13/004,630) that processes the engine harmonic enhancement signal, he(t), through a separate equalization filter for each loudspeaker 422-1-422-4 and 424 of FIG. 4. The engine harmonic enhancement signal, he(t), can be monophonic, indicating that the same signal is provided to all loudspeakers 422-1-422-4 and 424 (FIG. 4), or may be multichannel, for example stereophonic.

Systems that implement the techniques described above can be implemented in software, firmware, in digital electronic circuitry, or in computer hardware, or in combinations of them. The systems can include a computer program product tangibly embodied in a machine-readable storage device for execution by a programmable processor, and method steps can be performed by programmable processor executing a program of instructions to perform functions by operating on input data and generating output. The systems can be implemented in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, a processor will receive instructions and data from read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by or, or incorporated in, ASICs (application-specific integrated circuits).

A number of implementations have been described. Nevertheless, it will be understood that additional modifications may be made without departing from the spirit and scope of the inventive concepts described herein, and, accordingly, other implementations are within the scope of the following claims.

What is claimed is:

1. A method comprising:
   in a vehicle engine harmonic enhancement system,
   receiving an RPM signal representing a current RPM of a vehicle engine;
   based on the RPM signal, determining an instant magnitude, $\bar{c}_k(t)$, for each of N harmonics of a target engine sound by interpolating the instant magnitude, $\bar{c}_k(t)$, from a vector $[C_k]$, wherein the vector $[C_k]$ comprises samples of an RPM-dependent shape, $\tilde{c}_k(RPM)$, for each of the N harmonics over a subset of RPM values;

based on the RPM signal, determining an instant phase, $\bar{p}_k(t)$, for each of the N harmonics by interpolating the instant phase, $\bar{p}_k(t)$, from a vector $[P_k]$, wherein the vector $[P_k]$ comprises samples of an RPM-dependent phase $\tilde{p}_k(RPM)$, for each of the N harmonics over the subset of RPM values;

smoothing the instant magnitude, $\bar{c}_k(t)$, to generate a smoothed harmonic magnitude, $\hat{c}_k(t)$, for each of the N harmonics;

smoothing the instant phase, $\bar{p}_k(t)$, to generate a smoothed harmonic phase, $\hat{p}_k(t)$, for each of the N harmonics;

generating a magnitude perturbation signal, $dc_k(t)$, for each of the N harmonics;

generating a phase perturbation signal, $dp_k(t)$, for each of the N harmonics; and generating an individual harmonic signal, $h_k(t)$, for each of the N harmonics according to: $h_k(t) = (\hat{c}_k(t) + dc_k(t)) \cdot \sin(2\pi f l_k t + \hat{p}_k(t) + dp_k(t))$;

summing the individual harmonic signals, $h_k(t)$, and thereby generating an engine harmonic enhancement signal, he(t) to be added on top of a baseline engine sound; and transducing the engine harmonic enhancement signal, he(t), to acoustic energy.

2. The method of claim 1, wherein generating the magnitude perturbation signal comprises generating the magnitude perturbation signal, $dc_k(t)$, for each of the N harmonics according to:

$$dc_k(t) = ncf_k(t) \cdot \frac{\sigma_{\Delta c_k}}{\sigma_{ncf_k}},$$

where $\sigma_{\Delta c_k}$, is the standard deviation of fluctuations in the harmonic magnitude of each of the N harmonics of the target engine sound; $ncf_k(t)$ is filtered random noise used for generating the magnitude perturbation signal; and $\sigma_{ncf_k}$ is the standard deviation for the filtered random noise used for generating the magnitude perturbation signal.

3. The method of claim 1, wherein generating the phase perturbation signal comprises generating the phase perturbation signal, $dp_k(t)$, for each of the N harmonics according to:

$$dp_k(t) = npf_k(t) \cdot \frac{\sigma_{\Delta p_k}}{\sigma_{npf_k}},$$

where $\sigma_{\Delta p_k}$, is the standard deviation of fluctuations in the harmonic phase of each of the N harmonics of the target engine sound; $npf_k(t)$ is filtered random noise used for generating the phase perturbation signal; and $\sigma_{npf_k}$ is the standard deviation for the filtered random noise used for generating the phase perturbation signal.

4. An engine harmonic enhancement system, comprising:
a digital signal processor; and
a memory coupled to the digital signal processor and containing instructions that, when executed, cause the digital signal processor to:
receive an RPM signal representing a current RPM of a vehicle engine;

based on the RPM signal, determine an instant magnitude, $\bar{c}_k(t)$, for each of N harmonics of a target engine sound by interpolating the instant magnitude, $\bar{c}_k(t)$, from a vector $[C_k]$, wherein the vector $[C_k]$ comprises samples of an RPM-dependent shape, $\tilde{c}_k(RPM)$, for each of the N harmonics over a subset of RPM values;

based on the RPM signal, determine an instant phase, $\bar{p}_k(t)$, for each of the N harmonics by interpolating the instant phase, $\bar{p}_k(t)$, from a vector $[P_k]$, wherein the vector $[P_k]$ comprises samples of an RPM-dependent phase $\tilde{p}_k(RPM)$, for each of the N harmonics over the subset of RPM values;

smooth the instant magnitude, $\bar{c}_k(t)$, to generate a smoothed harmonic magnitude, $\hat{c}_k(t)$, for each of the N harmonics;

smooth the instant phase, $\bar{p}_k(t)$, to generate a smoothed harmonic phase, $\hat{p}_k(t)$, for each of the N harmonics;

generate a magnitude perturbation signal, $dc_k(t)$, for each of the N harmonics;

generate a phase perturbation signal, $dp_k(t)$, for each of the N harmonics; and generate an individual harmonic signal, $h_k(t)$, for each of the N harmonics according to: $h_k(t) = (\hat{c}_k(t) + dc_k(t)) \cdot \sin(2\pi f l_k t + \hat{p}_k(t) + dp_k(t))$;

sum the individual harmonic signals, $h_k(t)$, and thereby generating an engine harmonic enhancement signal, he(t) to be added on top of a baseline engine sound; and transduce the engine harmonic enhancement signal, he(t), to acoustic energy.

5. The engine harmonic enhancement system of claim 4, wherein, when executed, the instructions cause the one or more processors to generate the magnitude perturbation signal, $dc_k(t)$, for each of the N harmonics according to:

$$dc_k(t) = ncf_k(t) \cdot \frac{\sigma_{\Delta c_k}}{\sigma_{ncf_k}},$$

where $\sigma_{\Delta c_k}$, is the standard deviation of fluctuations in the harmonic magnitude of each of the N harmonics of the target engine sound; $ncf_k(t)$ is filtered random noise used for generating the magnitude perturbation signal; and $\sigma_{ncf_k}$ is the standard deviation for the filtered random noise used for generating the magnitude perturbation signal.

6. The engine harmonic enhancement system of claim 4, wherein, when executed, the instructions cause the one or more processors to generate the phase perturbation signal, $dp_k(t)$, for each of the N harmonics according to:

$$dp_k(t) = npf_k(t) \cdot \frac{\sigma_{\Delta p_k}}{\sigma_{npf_k}},$$

where $\sigma_{\Delta p_k}$, is the standard deviation of fluctuations in the harmonic phase of each of the N harmonics of the target engine sound; $npf_k(t)$ is filtered random noise used for generating the phase perturbation signal; and $\sigma_{npf_k}$ is the standard deviation for the filtered random noise used for generating the phase perturbation signal.

\* \* \* \* \*